… [19] United States Patent
Yamano et al.

[11] Patent Number: 5,437,957
[45] Date of Patent: Aug. 1, 1995

[54] LITHOGRAPHIC PRINTING PLATE

[75] Inventors: Motozo Yamano; Kozo Haino; Akio Yoshida; Hidetoshi Miura, all of Tokyo, Japan

[73] Assignee: Mitsubishi Paper Mills Limited, Japan

[21] Appl. No.: 191,498

[22] Filed: Feb. 4, 1994

[30] Foreign Application Priority Data

Feb. 5, 1993 [JP] Japan .................. 5-018964
May 26, 1993 [JP] Japan .................. 5-124154

[51] Int. Cl.$^6$ .............................................. G03C 3/00
[52] U.S. Cl. .................. 430/232; 430/204; 430/227; 430/264
[58] Field of Search ............... 430/204, 232, 227, 264

[56] References Cited
U.S. PATENT DOCUMENTS

| | | | |
|---|---|---|---|
| 4,115,124 | 9/1978 | Hamilton et al. | 430/232 |
| 4,160,670 | 7/1979 | Tsubai et al. | 430/204 |
| 4,734,354 | 3/1988 | Takagi | 430/232 |
| 4,746,594 | 5/1988 | Kasawa et al. | 430/264 |
| 5,108,871 | 4/1992 | Yamano | 430/232 |
| 5,236,802 | 8/1993 | Yamano et al. | 430/232 |

FOREIGN PATENT DOCUMENTS 0494874  10/1990  European Pat. Off. .
5309969  11/1993  Japan .

OTHER PUBLICATIONS

Database WPI, Section Ch, Week 9249, Derwent Publications Ltd., London, GB; Class A14, AN 92-402334 & JP-A-4 298 752 (Mitsubishi Paper Mills, Ltd.) 22 Oct. 1992 *abstract*.

*Primary Examiner*—Thomas R. Neville
*Attorney, Agent, or Firm*—Cushman Darby & Cushman

[57] ABSTRACT

Disclosed is a lithographic printing plate material comprising a support and, provided thereon, at least a silver halide emulsion layer and a physical development nuclei layer wherein the physical development nuclei layer and/or a layer contiguous thereto contains at least one of water-soluble polymers represented by the following formula (I) or at least one of water-soluble polymers represented by the following formula (II):

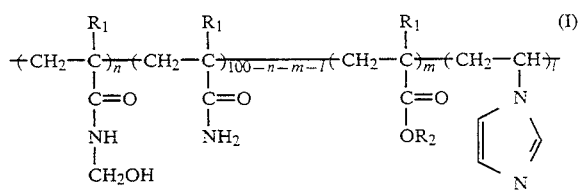

wherein $R_1$ represents H or an alkyl group, $R_2$ represents H or an alkali metal atom, n is 1–100 mol %, m is 0–50 mol % and l is 0–5 mol %,

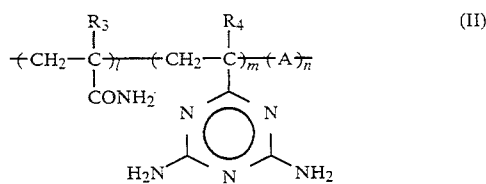

wherein $R_3$ and $R_4$ each represent a hydrogen atom or a lower alkyl group and A represents a residue of an ethylenically unsaturated monomer, l is 99.9–40 mol %, m is 0.1–10 mol % and n is 0–50 mol %. The polymer of the formula (I) may be used in combination with a water-soluble polysaccharide.

8 Claims, No Drawings

LITHOGRAPHIC PRINTING PLATE

BACKGROUND OF THE INVENTION

The present invention relates to a lithographic printing plate material to which silver complex diffusion transfer process is applied for making printing plates.

A lithographic printing plate comprises an oleophilic image area which is receptive to oily inks and an ink-repellent non-image area which is not receptive to inks. In general, said non-image area comprises a hydrophilic area receptive to water. In usual lithographic printing, both water and ink are fed to the surface of the printing plate to allow the image area to receive preferentially the colored ink and the non-image area to receive preferentially water and then the ink on the image is transferred onto a material to be printed, such as paper.

Accordingly, in order to obtain prints of good quality, it is important that the difference of oleophilicity or hydrophilicity between the surface of the image and that of the non-image is sufficiently large, so that when water and ink are applied to the surface of the printing plate the image can receive sufficient amount of ink while the non-image completely repels the ink.

Lithographic printing plates made by silver complex diffusion transfer process (DTR process), especially, those which have a physical development nuclei layer on a silver halide emulsion layer are disclosed, for example, in U.S. Pat. Nos. 3,728,114, 4,134,769, 4,160,670, 4,336,321, 4,501,811, 4,510,228 and 4,621,041. The exposed silver halide crystal undergoes chemical development by DTR development to become black silver which serves as a hydrophilic non-image area. On the other hand, unexposed silver halide crystal is converted to a silver complex by a silver salt complexing agent contained in the developer and the complex diffuses to the surface physical development nuclei layer and physical development occurs due to the presence of nuclei to form an image mainly composed of ink-receptive physically developed silver.

In this way, in the lithographic printing plate, a silver image precipitated on the physical development nuclei layer provided on a gelatin-silver halide emulsion layer is utilized as an ink-receptive image and the lithographic printing plate suffers from the problems that its resistance against mechanical abrasion is insufficient as compared with general lithographic printing plates such as PS plate and the image is torn off or the ink-receptivity of the image is gradually lost.

If hardness of gelatin is enhanced or amount of the physical development nuclei is increased in order to overcome these problems, the background areas are stained resulting in serious decrease of printing endurance. Furthermore, staining of the background occurs or ink-receptivity deteriorates during storage of long period of from production of lithographic printing plate materials to making of printing plates therefrom and solution of these problems have been desired. As an approach to improve water retentivity (stain resistance), Japanese Patent Application No. Kokai No. 4-277748 proposes to contain at least one water-soluble synthetic polymer such as acrylamide polymer and/or acrylamide-acrylic acid copolymer in the physical development nuclei layer and/or a layer contiguous thereto. However, the improvement is still insufficient.

SUMMARY OF THE INVENTION

An object of the present invention is to provide a lithographic printing plate improved in water retentivity, high in sensitivity and less in stain caused by printing which is produced using the silver complex diffusion transfer process.

Another object of the present invention is to provide a lithographic printing plate improved in storage stability of printing performance which is produced using the silver complex diffusion transfer process.

The above objects have been attained by providing a lithographic printing plate material comprising a support and, provided thereon, at least a silver halide emulsion layer and a physical development nuclei layer wherein the physical development nuclei layer and/or a layer contiguous thereto contains at least one of water-soluble polymers represented by the following formula (I) or at least one of polymers represented by the following formula (II) having a functional group which imparts hydrophilicity and a functional group which has affinity with the physical development nuclei:

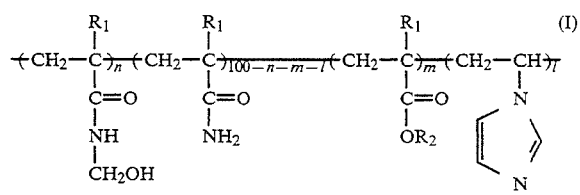

(wherein $R_1$ represents H or an alkyl group, $R_2$ represents H or an alkali metal atom, n represents 1–100 mol %, m represents 0–50 mol % and l represents 0–5 mol %, and the polymer has an average molecular weight of 2000–300,000).

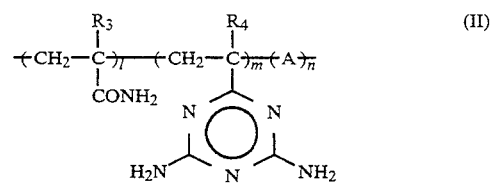

(wherein $R_3$ and $R_4$ each represent a hydrogen atom or a lower alkyl group such as methyl group, ethyl group or propyl group and A represents a residue of an ethylenically unsaturated monomer, l represents 99.9–40 mol %, m represents 0.1–10 mol %, more preferably 0.5–5 mol % and n represents 0–50 mol %).

Examples of the ethylenically unsaturated monomer are generally used monomers or derivatives thereof such as ethylene, propylene, butene, vinyl chloride, vinylidene chloride, acrylonitrile, methacrylonitrile, vinyl acetate, methyl acrylate, methyl methacrylate, acrylic acid, styrene, sodium styrenesulfonate, vinyl imidazole and maleic anhydride. In this case, the monomer A is added for adjustment of solubility of the polymer in the physical development nuclei coating solution and viscosity and liquid properties (pH) of the coating solution and may not be contained as a comonomer.

Furthermore, the objects of the present invention can be more effectively attained by using a water-soluble polysaccharide in combination with the above polymer represented by the formula (I).

DESCRIPTION OF THE INVENTION

The content of the polymer represented by the formula (I) or (II) or the total content of the polymer represented by the formula (I) and the water-soluble polysaccharide is preferably 0.5 g/m² or less, more preferably 0.001–0.2 g/m². The ratio of the content of the polymer represented by the formula (I) and that of the water-soluble polysaccharide when these are used in combination is preferably 1:2–1:8.

Typical examples of the polymer represented by the formula (I) are shown below.

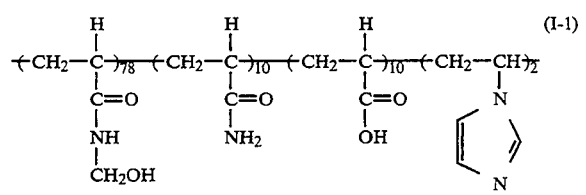
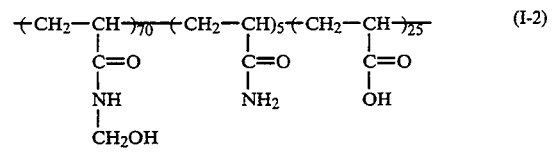
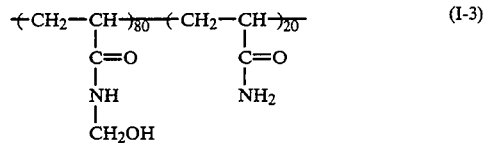
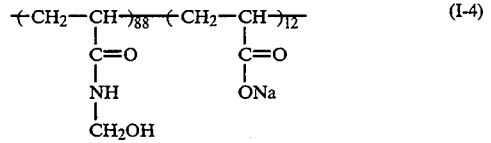
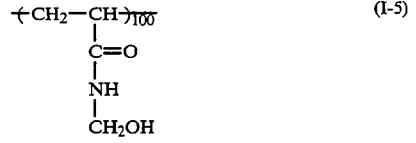
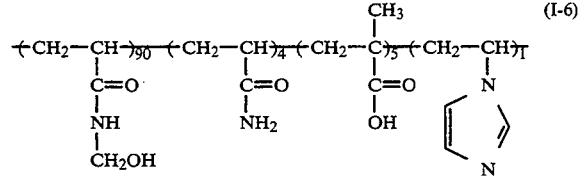
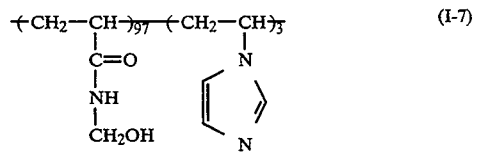
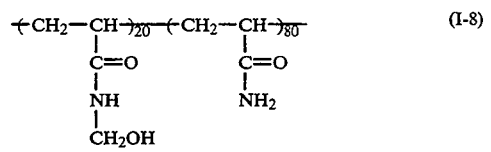
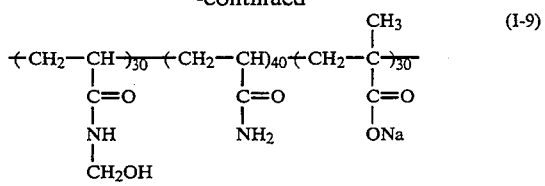
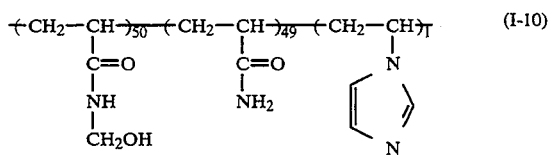

Typical examples of the polymer represented by the formula (II) are shown below.

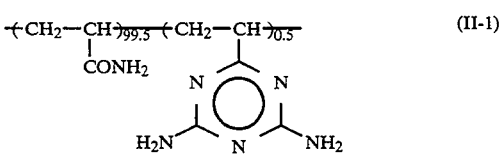
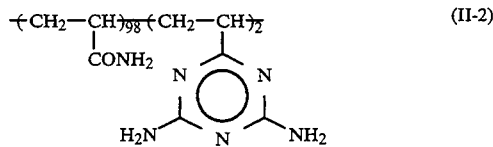
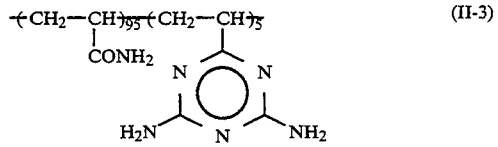
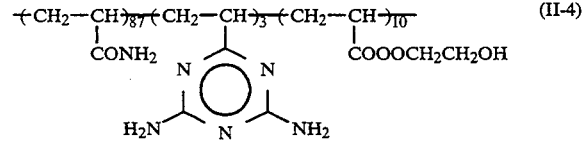
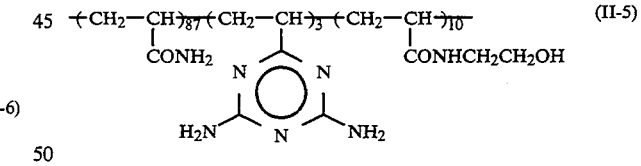
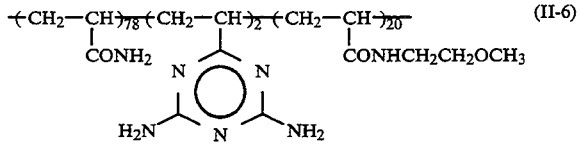
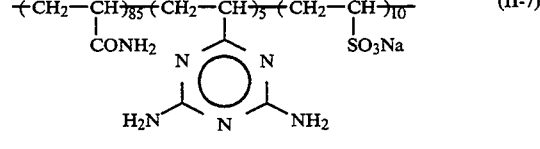
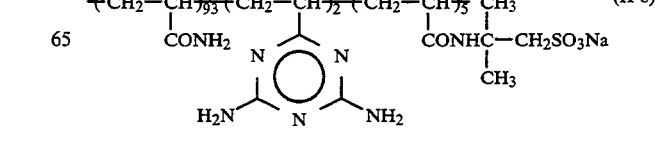

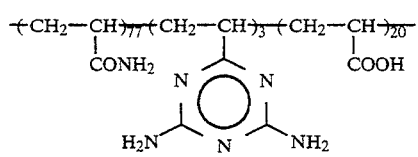

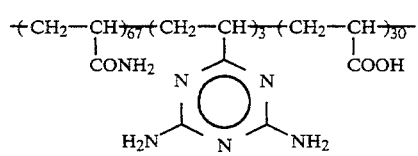

The polymers may be contained in the constituting layer, namely, physical development nuclei layer and/or a layer contiguous thereto by any methods. For example, they can be contained before or after coating of the physical development nuclei, but from the points of stability of quality and easiness of preparation it is most advantageous to add them together with the physical development nuclei and it is convenient to add them at the time of preparation of the coating solution.

The molecular weight of the polymer represented by the formula (I) affects the fixability of the polymer during development treatment (not flowing out of the layer), stability of the coating solution and coatability and is preferably 10,000–500,000, more preferably 50,000–200,000. In the formula (I), n is more preferably 20–100 mol %. When m exceeds 50 mol %, ink-receptivity deteriorates and when l exceeds 5 mol %, printing endurance is inferior.

The polymers represented by the formula,(I) or (II) can be used each alone or in combination of two or more. Furthermore, the polymer may be used in combination with general water-soluble polymers such as gelatin, polyvinyl alcohol, carboxymethylcellulose, hydroxyethylcellulose, gum arabic, sodium alginate and copolymers of vinylimidazole and acrylamide, acrylamide and acrylic acid or acrylamide and vinylpyridine described in Japanese Patent Kokai No. 53-21602. Thus, the effect of the polymer can further be enhanced.

When only the other general water-soluble polymer is used alone, ink-receptivity deteriorates with increase of the amount of the polymer added. On the other hand, the polymer of the present invention causes substantially no deterioration of ink-receptivity with increase of the amount and exhibits its effect with use of it in a smaller amount than the other polymers and naturally the polymer of the present invention hardly causes problems such as deterioration in printing endurance, ink-receptivity and the like.

The polymer represented by the formula (I) is synthesized in the following manner. 300 cc of 4% potassium persulfate is added to 400 cc of pure water through which nitrogen gas has been passed for 15 minutes at a bath temperature of 65° C. Then, thereto is added an aqueous solution containing n mol % of acrylamide monomer, m mol % of acrylic acid monomer and l mol % of vinylimidazole monomer (3 mol in total) and 100 cc of isopropyl alcohol and after lapse of 120 minutes, 100 cc of 3% dihydroxyethylaniline is added to complete polymerization.

To the resulting polymer is added 1–100 mol % of formalin and pH is adjusted to 11 with sodium hydroxide, followed by methylolation at 30° C. for 6 hours to synthesize a polymer represented by the formula (I) of the present invention.

$R_1$ of the polymer represented by the formula (I) is H or an alkyl group and $R_2$ is H or an alkali metal atom. The alkyl group is preferably methyl or ethyl group since the polymer must be water-soluble in view of the object of the present invention.

The average polymerization degree of the polymer represented by the formula (II) is about 50 to about 3000, preferably about 100 to about 1000 and the molecular weight thereof is 2,000–300,000. When the average polymerization degree is outside the above range, the effect to inhibit the occurrence of stain in printing decreases or the above-mentioned defects are apt to occur. The polymerization degree of the polymer is an important factor in view of colloid protecting action and viscosity increasing action in preparing heavy metal sulfide colloid particles (physical development nuclei) and in coating the nuclei.

The polymer of the formula (II) may be added in the same manner as the polymer of the formula (I).

The polymer of the formula (II) having hydrophilic activity can be prepared, for example, by the conventional process of vinyl polymerization. That is, it can be obtained by adding a polymerization initiator to a solution of a mixture of two or three kinds of vinyl monomers and heating the solution or by adding dropwise a mixture of the monomers to a solution containing a polymerization initiator kept at a high temperature. Many monomers usable for the vinyl polymerization are known (See, for example, "Gosei Kobunshi II" published from Asakura Shoten K. K.). As the solvents used for the polymerization, there may be used common solvents such as water, methanol, ethanol, isopropanol, acetone, tetrahydrofuran, benzene, toluene, DMF, DMSO and dioxane and mixtures thereof. As the polymerization initiator, there may be used generally known ones such as potassium persulfate, hydrogen peroxide, benzoyl peroxide, azobisisobutyronitrile and cumene hydroperoxide.

The water-soluble polysaccharides used in combination with the polymer of the formula (I) include, for example, pullulan (PF-20, PI-20 manufactured by Hayashibara Co., Ltd.), Trigluco A (manufactured by Hayashibara Co., Ltd.), guagum (GUARANATE GC250, GSM-3, ICI Societe Francaisedes Colloides), Soa Locust A120 (locust bean gum manufactured by Mitsubishi Rayon Co., Ltd.), and Gliloid (tamarind seed polysaccharides manufactured by Dainippon Seiyaku Co., Ltd.) and these are sold under their tradenames. That is, they are water-soluble polysaccharides which are desirably acid and alkali resistant and not basic. The water-soluble polysaccharides used in the present invention are described in "The Newest Processing, Improvement and Development of Use of Water-soluble polymer and Water-dispersed Type Resin" (planned by Kaimen Kagaku Kenkyusho and published from Keiei Kaihatsu Center).

In addition, at least one of monosaccharides or oligosaccharides can be contained in the physical development nuclei layer and/or layers contiguous thereto.

The monosaccharides or oligosaccharides used in the present invention are available from Hayashibara Shoji Co., Ltd. and are selected from maltose products, oligo products, sugaralcohol products and the like which belong to monosaccharides or oligosaccharides.

The monosaccharides and oligosaccharides used in the present invention are chain polyhydric alcohols containing one carbonyl group. The simplest saccharides are those which have one carbonyl group and two alcohol groups, but since the natural saccharides all have the carbonyl group capable of producing a semiacetal bond in the molecule, only those which contain at least four oxygen atoms are taken to be monosaccharides in the books such as "Beilsteins Handbuch der org. Chemie, Bd.XXXI Kohlenhydrate" (1938). The oligosaccharides are saccharides comprising 2-6 molecules of monosaccharides which are bonded to each other. The monosaccharides in the oligosaccharide are bonded in ether form through an oxygen atom and the oligosaccharide is decomposed to the component monosaccharides upon hydrolysis. Oligosaccharides such as maltose, lactose and sucrose which are hydrolyzed into two molecules of monosaccharides are called disaccharides and those which are hydrolyzed into three molecules of monosaccharides such as raffinose are called trisaccharides.

Since the above monosaccharides and oligosaccharides are smaller in molecular weight than pullulan (polysaccharides) disclosed in Japanese Patent Kokai No. 4-277747, when they are used in physical development nuclei layer, permeability is improved, coatability of the layer is superior and ink-receptivity in printing is improved. Further advantage is that when they are used in a gelatin layer contiguous to the physical development nuclei layer, viscosity of the gelatin layer does not increase.

The lithographic printing plate material of the present invention contains gelatin, and the layers containing the gelatin can be undercoat layer, emulsion layer and physical development nuclei layer. These gelatin-containing layers can be hardened with gelatin hardeners. The gelatin hardeners include, for example, inorganic compounds such as chrome alum; aldehydes such as formaldehyde, glyoxal, malealdehyde and glutaraldehyde, N-methylol compounds such as urea and ethyleneurea, aldehydes such as mucochloric acid and 2,3-dihydroxy-1,4-dioxane, compounds having active hydrogen such as 2,4-dichloro-6-hydroxy-S-triazine salt and 2,4-dihydroxy-6-chloro-triazine salt, divinyl sulfone, divinyl ketone, N,N,N-triacryloylhexahydrotriazine, compounds having two or more active 3-membered rings such as ethyleneimino group and epoxy group in the molecule, dialdehyde starch as a polymeric hardener. These may be used each alone or in combination of two or more.

The hardener can be added to all or some of the layers or only one layer. Of course, a diffusible hardener can be added to only one of the two layers when these are coated simultaneously. The hardener can be added at the time of preparation of emulsion or at the time of coating in in-line manner.

The gelatin in the gelatin-containing layers can be partially replaced with one or more of hydrophilic polymers such as water-soluble gelatin, starch, dextrin, albumin, sodium alginate, hydroxyethylcellulose, gum arabic, polyvinyl alcohol, polyvinyl pyrrolidone, carboxymethylcellulose, polyacrylamide, styrene-maleic anhydride copolymer, and polyvinylmethyl ether-maleic anhydride copolymer. Furthermore, vinyl polymer aqueous dispersion (latex) can be added to the gelatin-containing layers.

Amount of polymeric binder in the undercoat layer is generally 0.5-10 g/m$^2$, more preferably 1-6 g/m$^2$. The undercoat layer may contain pigments such as carbon black or dyes for the purpose of antihalation and may further contain solid powders of 2-10 microns in average particle size such as silica particles for improvement of printing endurance. Further, photographic additives such as developing agent may also be contained. Moreover, the undercoat layer may be such one as described in Japanese Patent Kokai Nos.48-5503, 48-100203 and 49-16507.

The silver halide emulsion layer comprises, for example, silver chloride, silver bromide, silver chlorobromide or these silver halides containing silver iodide. The silver halide crystals may contain heavy metal salts such as rhodium salts, iridium salts, palladium salts, ruthenium salts, nickel salts and platinum salts and amount thereof is $10^{-8}-10^{-3}$ mol per 1 mol of silver halide. Crystal form of the silver halide has no special limitation and the crystals may be in the form of cubic or fourteen-faced polyhedron grains and besides, may be in the form of core-shell or platy grains. The silver halide crystal may be monodispersed or polydispersed and average grain size thereof is 0.2-0.8 μm. One preferred example of the silver halide crystal is a monodispersed or polydispersed crystal comprising at least 80 mol % of silver chloride and containing a rhodium salt or iridium salt.

The silver halide emulsion can be sensitized by various methods during its preparation or coating. The emulsion is preferably sensitized chemically by the methods well known to the art by using, for example, sodium thiosulfate, alkylthioureas or gold compounds such as gold rhodanide and gold chloride or mixtures thereof. The silver halide emulsion can also be positively or negatively sensitized or desensitized with dyes such as cyanine and merocyanine dyes. The wavelength to which the emulsion is sensitized or desensitized has no special limitation. Therefore, the emulsion can be orthochromatically or panchromatically sensitized, or sensitized for exposure to helium-neon laser, argon laser, LED or semiconductor laser, or can be sensitized for UV or desensitized against visible light for use under roomlight.

The surface layer present over the emulsion layer contains physical development nuclei. The physical development nuclei include, for example, metal colloid fine particles such as silver, antimony, bismuth, cadmium, cobalt, lead, nickel, palladium, rhodium, gold and platinum, sulfides, polysulfides and selenides of these metals, and mixtures and mixed crystals thereof. The physical development nuclei may not contain hydrophilic binders, but may contain, as hydrophilic binders, hydrophilic polymers such as gelatin, starch, dialdehyde starch, carboxymethyl-cellulose, gum arabic, sodium alginate, hydroxyethyl-cellulose, polystyrenesulfonic acid, vinyl imidazoleacrylamide copolymer and polyvinyl alcohol or oligomers thereof. Content of the binder is preferably 0.5 g/m$^2$ or less. The physical development nuclei layer may further contain developing agents such as hydroquinone, methylhydroquinone and catechol and known hardeners such as formaldehyde and dichloro-S-triazine.

The undercoat layer, silver halide emulsion layer and physical development nuclei layer may contain some of anionic, cationic or neutral surface active agents as coating aids and may further contain antifoggant, matting agent, thickener and antistatic agent.

The supports for lithographic printing plates of the present invention may be any of those which can stand lithogrpahic printing such as paper, synthetic or semisynthetic polymer films, and metal sheets such as aluminum and iron. One or both sides of the support may be covered with one or more polymer films or metallic thin films. The surface of the supports may be subjected to a surface treatment for enhancing adhesion to the coated layer.

Especially preferred supports are papers coated with polyolefin polymer on one or both sides, polyester films, polyester films the surface of which is subjected to hydrophilizing treatment and aluminum sheets subjected to surface treatment. These supports may contain pigments for antihalation or solid fine particles for improvement of surface properties. The supports may be light transmissible so as to be able to be exposed from back side.

The processing solution used in the present invention can contain alkaline materials such as sodium hydroxide, potassium hydroxide, lithium hydroxide, trisodium phosphate, preservatives such as sulfites, silver halide solvents such as thiosulfates, thiocyanates, cyclic imides, 2-mercaptobenzoic acid and amines, thickeners such as hydroxyethylcellulose and carboxymethylcellulose, antifoggants such as potassium bromide and compounds described in Japanese Patent Kokai No. 47-26201, developing agents such as hydroquinone, catechol and 1-phenyl-3-pyrazolidone, and development modifiers such as polyoxyalkylene compounds and onium compounds. Furthermore, the processing solution may contain compounds which improve ink-receptivity of the surface silver layer as described in U.S. Pat. No. 3,776,728.

The surface silver layer of the lithographic printing plate material of the present invention after subjected to development can be rendered ink-receptive or enhanced in the ink-receptivity with optional known surface treating agents. The treating agents are such as those which are described in U.S. Pat. No. 3,721,559 and Japanese Patent Kokoku No. 48-29723. Printing method, etch solution and dampening solution may be those which are customarily used in the art.

The following nonlimiting examples illustrate the present invention.

EXAMPLE 1

A matting layer containing silica particles of 5 μ in average particle size was provided on one side of a both-side polyethylene coated paper of 135 g/m². On another side of the paper which had been subjected to corona discharge treatment were simultaneously coated an undercoat layer (gelatin 3.5 g/m²) containing carbon black and silica powders of 7 μ in average particle size and thereon an orthochromatically sensitized high-sensitivity silver chloride emulsion (containing 0.8 g/m² of gelatin) containing 0.1 g/m² of 1-phenyl-3-pyrazolidone at a coating amount of 1.0 g/m² in terms of silver nitrate.

The undercoat layer contained 170 mg/m² of 2,4-dichloro-6-hydroxy-S-triazine sodium as a hardener and the emulsion layer contained 80 mg/m² of N-methylolethyleneurea as a hardener. After drying, on the emulsion layer was coated a nuclei coating solution described in Example 2 of U.S. Pat. No. 4,160,670 (containing acrylamide-imidazole copolymer of No. 3 as a polymer and 0.8 g/m² of hydroquinone as a developing agent) and dried to make lithographic printing plate material A as a comparative sample.

Lithographic printing plate materials C and D of the present invention were made in the same manner as in making the lithographic printing plate material A except that the nuclei coating solution contained 4 mg/m² or 10 mg/m² of the polymer represented by the following formula (I-1) in place of the acrylamideimidazole copolymer.

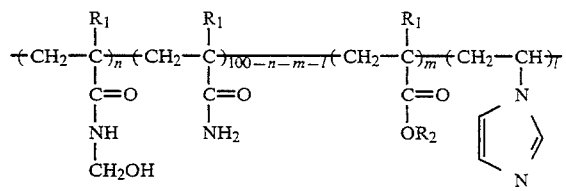

(wherein $R_1$ and $R_2$ represent H, n is 78 mol %, m is 10 mol % and 1 is 2 mol % and the polymer had an average molecular weight of 100,000).

Furthermore, lithographic printing plate material B was made as another comparative sample in the same manner as in making the lithographic printing plate material A except that the nuclei coating solution contained carboxymethylcellulose in an amount of 50 mg/m². These four lithographic printing plate materials just after prepared and after stored for 5 days under the conditions of 50° C., 80% RH were exposed imagewise in a process camera having an image reversing mechanism and subjected to development with the following silver complex diffusion transfer developer at 30° C. for 1 minute.

| Transfer developer: | |
| --- | --- |
| Water | 700 ml |
| Potassium hydroxide | 20 g |
| Anhydrous sodium sulfite | 50 g |
| 2-Mercaptobenzoic acid | 1.5 g |
| 2-Methylaminoethanol | 15 g |
| Water was added to make up totally 1 liter. | |

After the development, the treated material was passed between two squeeze rollers to remove excess developer, then immediately treated with the following neutralizing solution at 25° C. for 20 seconds, passed between the squeeze rollers to remove excess solution and dried at room temperature.

| Neutralizing solution: | |
| --- | --- |
| Water | 600 ml |
| Citric acid | 10 g |
| Sodium citrate | 35 g |
| Colloidal silica (20% solution) | 5 ml |
| Ethylene glycol | 5 ml |
| Water was added to make up totally 1 liter. | |

The thus obtained lithographic printing plates were mounted on an offset printing machine and the following etch solution was applied all over the plate surface and printing was carried out using the following dampening solution.

| Etch solution: | |
| --- | --- |
| Water | 600 ml |
| Isopropyl alcohol | 400 ml |
| Ethylene glycol | 50 g |
| 3-Mercapto-4-acetamide-5-n-heptyl-1,2,4-triazole | 1 g |
| Dampening solution: | |
| o-Phosphoric acid | 10 g |
| Nickel nitrate | 5 g |
| Sodium nitrite | 5 g |

| | |
|---|---|
| Ethylene glycol | 100 g |
| Colloidal silica (20% solution) | 28 g |
| Water was added to make up totally 2 liters. | |

Water was added to make up totally 2 liters.

The printing machine used was A. B. Dick 350CD (trademark for the offset printing machine manufactured by A. B. Dick Co.). The printing endurance was evaluated in terms of the number of copies obtained before the printing had become impossible owing to the stain of non-image portion and the occurrence of disappearance of images caused by tearing off of the silver image portion and graded by the following criteria.

The number of copies
○: 10,000–20,000
△: 5,000–10,000
x: 2,000–5,000

The results are shown in Table 1.

Separately, water retentivity (stain resistance) of the non-image portion was evaluated in the following manner. Printing was carried out by A. B. Dick 350CD using F Gloss Purple 68S manufactured by Dainippon Ink & Chemicals Inc. as an ink and water as a dampening solution and the water retentivity was evaluated in terms of the number of copies obtained before the printing had become impossible owing to the occurrence of stain in the non-image portion and graded by the following criteria.

The number of copies
○: More than 1000
△: 300–1,000
x: 1–300

The results are shown in Table 1.

A test on ink-receptivity was also conducted in the evaluation of the printing endurance mentioned above. The results are shown in Table 1 in terms of the number of papers fed before clear copies began to be produced.

TABLE 1

| | Printing endurance | | Water retentivity | | Ink-receptivity | |
|---|---|---|---|---|---|---|
| | Just after preparation | After stored | Just after preparation | After stored | Just after preparation | After stored |
| Comparative Sample A | ○ | ○ | △ | x | 10 | 8 |
| Comparative Sample B | △ | △ | △ | x | 20 | 10 |
| The present sample C | ○ | ○ | ○ | ○ | 10 | 8 |
| The present sample D | ○ | ○ | ○ | ○ | 10 | 10 |

It can be seen from the above results that lithographic printing plates made using the water-soluble synthetic polymer represented by the formula (I) according to the present invention are excellent in various printing characteristics, especially in water retentivity and besides excellent in stability with time.

Lithographic printing plates of Examples 2-10 were produced in the same manner as in Example 1 except that polymers represented by the following formulas (I-2)–(I-10) were used in place of the polymer represented by the formula (I-1).

EXAMPLE 2

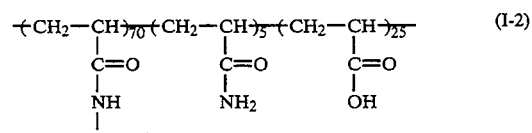

(Average molecular weight: 100,000)

EXAMPLE 3

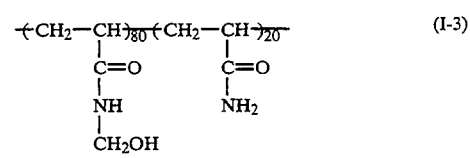

(Average molecular weight: 30,000)

EXAMPLE 4

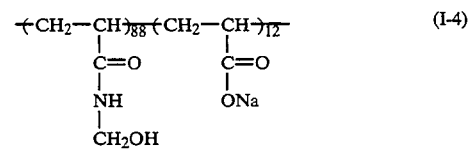

(Average molecular weight: 2,500)

EXAMPLE 5

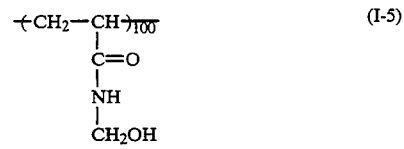

(Average molecular weight: 300,000)

EXAMPLE 6

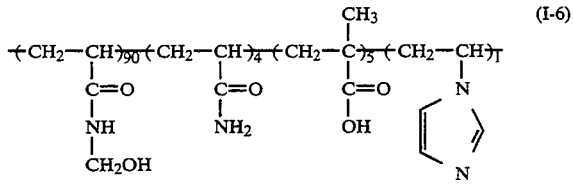

(Average molecular weight: 50,000)

EXAMPLE 7

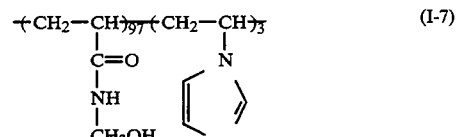

(Average molecular weight: 150,000)

EXAMPLE 8

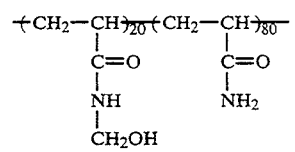

(Average molecular weight: 200,000)

EXAMPLE 9

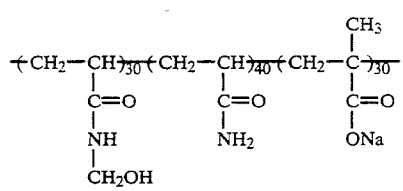

(Average molecular weight: 100,000)

EXAMPLE 10

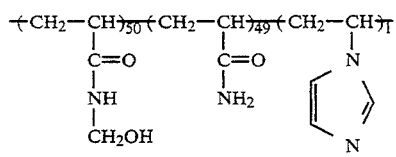

(Average molecular weight: 100,000)

As in the Example 1, it was confirmed that the lithographic printing plates made using the water-soluble synthetic polymers represented by the above formulas (I-2)-(I-10) according to the present invention were excellent in various printing characteristics, especially in water retentivity and besides excellent in stability with time.

EXAMPLE 11

(i) Preparation of the Polymer Represented by the Formula (II-2):

20 ml of distilled water was charged in a 100 ml three-necked flask and stirred with heating at 65° C. in a nitrogen stream and 50 mg of potassium persulfate was added thereto. To the resulting solution kept at the same temperature was added dropwise over 1 hour a solution which was prepared by dissolving 10.7 g (0.147 mol) of acrylamide and 0.41 g (0.003 mol) of 2-vinyl-4,6-diamino-S-triazine in a mixed solvent composed of 7 ml of distilled water and 5 ml of isopropyl alcohol and then adding 1.0 g of 14% nitric acid to the solution. After completion of the addition of the solution, the mixture was stirred for further 1 hour to carry out polymerization and a small amount of an alcoholic methylhydroquinone solution was added to terminate the reaction. The thus obtained polymer of the present invention had a molecular weight of about 90,000 measured by GPC method. Other polymers represented by the formula (II) can also be prepared by the similar process.

Comparative polymers having the following formulas (a) and (b) were prepared in the same manner as above.

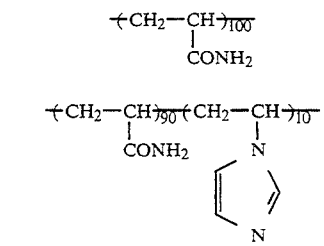

(ii) Preparation of Lithographic Printing Plate Material

A gelatin solution containing carbon black was coated on a polyethylene-coated paper of 135 g/m² which had been subjected to corona discharge treatment and then, thereon was coated an orthochromatically sensitized high contrast silver chloride emulsion. This emulsion layer comprised 1.5 g/m² of silver halide in terms of silver nitrate and 1.5 g/m² of gelatin and contained formalin and dimethylolurea as hardener. The resulting light-sensitive silver halide photographic material was heated at 40° C. for 3 days and a coating solution containing physical development nuclei and the polymer of the present invention was prepared in the following manner and coated on the emulsion layer.

(1) Preparation of palladium sulfide sol:

| Solution A: | |
|---|---|
| Palladium chloride | 5 g |
| Hydrochloric acid | 40 ml |
| Water | 1000 ml |
| Solution B: | |
| Sodium sulfide | 8.6 g |
| Water | 1000 ml |

The solution A and the solution B were mixed with stirring and after 30 minutes, the mixture was passed through a column packed with ion exchange resin (IR-120E, IRA-400) to obtain a palladium sulfide sol.

(2) Preparation of physical development nuclei coating solution containing the polymer of the present invention:

| | |
|---|---|
| Palladium sulfide sol obtained above | 100 ml |
| Hydroquinone | 100 g |
| The polymer of the present invention (solid content) | 1 g |
| 10% Saponin (surface active agent) | 2 ml |
| Water was added to make up totally 2 liters. | |

The resulting coating solution was coated on the emulsion layer to obtain a lithographic printing plate material.

(iii) Processing:

The resulting lithographic printing plate material was exposed imagewise and then dipped in the following transfer developer at 30° C. for 30 seconds to perform transfer development and successively dipped in the following stop solution for 30 seconds (25° C.). The material was then squeezed to remove excess solution and dried under atmospheric condition.

| Transfer developer: | |
|---|---|
| Water | 1500 ml |
| Sodium hydroxide | 20 g |
| Sodium sulfite | 100 g |

-continued

| | |
|---|---|
| Hydroquinone | 12 g |
| 1-Phenyl-3-pyrazolidone | 1 g |
| Sodium thiosulfate | 10 g |
| Potassium thiocyanate | 5 g |
| Potassium bromide | 5 g |
| Water was added to make up totally 2 liters. | |
| Stop solution: | |
| Water | 2 l |
| Citric acid | 10 g |
| Sodium citrate | 35 g |

(iv) Printing

The thus obtained printing plate was mounted on an offset printing machine, A. B. Dick 350CD and the surface of the printing plate was wiped with the following solution. Then, printing was carried out. The printing room had a temperature of 22° C. and a humidity of 60%.

| Solution: | |
|---|---|
| Water | 400 ml |
| Citric acid | 1 g |
| Sodium citrate | 3.5 g |
| 2-Mercapto-5-heptyl-1,3,5-oxadiazole | 0.5 g |
| Ethylene glycol | 50 ml |

A commercially available dampening solution was used as a dampening solution and F Gloss Sumi B and F Gloss Konai manufactured by Dainippon Ink & Chemicals Inc. were used as ink. The F Gloss Kon-ai is one of the inks which are liable to cause stain on the above offset printing plates.

(v) Evaluation of photographic characteristics

The lithographic printing plate materials obtained above which were exposed through an optical wedge and subjected to development were measured on reflective density by an optical densitometer to obtain sensitivity (S) and tone (gamma.y). Sensitivity (S) is expressed by a relative value assuming the sensitivity of a fresh material produced using the comparative polymer (a) to be 100. Furthermore, in order to examine deterioration of the material when stored under heating, a fresh material was heated at 50° C. for 4 days and subjected to the same treatment as above and sensitivity (S') and tone ($\gamma'$) after the heat treatment were obtained. The results are shown in Table 2.

TABLE 2

| | Polymer | | | | | |
|---|---|---|---|---|---|---|
| No. | No. | Average molecular weight | Fresh S | $\gamma$ | After heat treatment S' | $\gamma'$ |
| 1 | (II-1) | 85,000 | 105 | 5.2 | 104 | 5.4 |
| 2 | (II-2) | 90,000 | 104 | 5.4 | 105 | 5.5 |
| 3 | (II-3) | 80,000 | 102 | 5.1 | 103 | 5.0 |
| 4 | (II-4) | 90,000 | 103 | 5.3 | 105 | 5.5 |
| 5 | (II-5) | 100,000 | 104 | 4.9 | 107 | 5.2 |
| 6 | (II-6) | 85,000 | 103 | 5.2 | 104 | 5.2 |
| 7 | (II-7) | 80,000 | 102 | 5.0 | 104 | 5.1 |
| 8 | (II-8) | 80,000 | 100 | 4.9 | 101 | 5.3 |
| 9 | (II-9) | 95,000 | 104 | 5.5 | 104 | 5.5 |
| 10 | (II-10) | 90,000 | 103 | 5.4 | 105 | 5.4 |
| 11 | (a) (Comparative) | 90,000 | 100 | 5.1 | 97 | 4.9 |
| 12 | (b) (Comparative) | 100,000 | 98 | 5.2 | 99 | 5.0 |

It can be seen from the results of Table 2 that the lithographic printing plate materials produced using the polymers of the present invention obtained by copolymerizing monomers having a diamino-S-triazine group are higher in sensitivity than the materials produced using the comparative polymers (a) and (b) and do not become soft in contrast even after subjected to heat treatment and are stable.

(vi) Evaluation of printing characteristics:

Printing was carried out using the printing plate in the same manner as above. The printing characteristics were evaluated by the degree of stain of the prints and graded in accordance with the following criteria.

5: Substantially no stain occurred.
4: The intermediate between 5 and 3.
3: Light stain partially occurred.
2: The intermediate between 3 and 1.
1: Light stain occurred on the whole surface.

The results are shown in Table 3.

TABLE 3

| No. | Polymer | Fresh | After heat treatment |
|---|---|---|---|
| 1 | (II-1) | 4 | 4 |
| 2 | (II-2) | 5 | 5 |
| 3 | (II-3) | 4 | 3 |
| 4 | (II-4) | 5 | 5 |
| 5 | (II-5) | 5 | 5 |
| 6 | (II-6) | 5 | 5 |
| 7 | (II-7) | 4 | 4 |
| 8 | (II-8) | 5 | 5 |
| 9 | (II-9) | 5 | 5 |
| 10 | (II-10) | 5 | 4 |
| 11 | (a) (Comparative) | 3 | 1 |
| 12 | (b) (Comparative) | 3 | 2 |

It can be seen from the results of Table 3 that the printing plates made using the polymer of the formula (II) are less in occurrence of stain by printing and have stable printing characteristics even after subjected to the heat treatment as compared with the printing plates made using the comparative polymers (a) and (b).

EXAMPLE 12

Example 1 was repeated except that the nuclei coating solution contained 2 mg/m² of the polymer of the formula (I-1) and 8 mg/m² of the water-soluble polysaccharides as shown in Table 4 thereby to make lithographic printing plate materials (A)–(I). These lithographic printing plate materials were evaluated in the same manner as in Example 1 except that evaluation on water retentivity was conducted in the following manner. Printing was carried out by A. B. Dick 350CD using F Gloss Purple 68N manufactured by Dainippon Ink & Chemicals Inc. as an ink and Eu-3, 1% solution (dampening solution/etch solution for PS plate manufactured by Fuji Photo Film Co., Ltd.) as a dampening solution and the water retentivity was evaluated in terms of the number of copies obtained before the printing had become impossible owing to the occurrence of stain in the non-image portion and graded by the following criteria.

The number of copies
◎: More than 5000
○: 3000–5000
△: 1000–3000
x: Less than 1000

The results are shown in Table 5.

TABLE 4

| Polymers and amount | | |
|---|---|---|
| Comparative A | Acrylamide-imidazole copolymer | (10 mg/m²) |
| Comparative B | Acrylamide-imidazole | (10 mg/m²) |

TABLE 4-continued

| Polymers and amount | | |
|---|---|---|
| | copolymer + CMC (50 mg/m²) | |
| The present C | (I-1)(2 mg/m²) + Pullulan PE20 | (8 mg/m²) |
| The present D | (I-1)(2 mg/m²) + Trigluco A | (8 mg/m²) |
| The present E | (I-1)(2 mg/m²) + Guagum | (8 mg/m²) |
| The present F | (I-1)(2 mg/m²) + Soa locust Al20 | (8 mg/m²) |
| The present G | (I-1)(2 mg/m²) + Gliloid | (8 mg/m²) |
| Comparative H | (I-1)(2 mg/m²) | |
| Comparative I | (I-1)(2 mg/m²) + CMC | (8 mg/m²) |

TABLE 5

| | Printing endurance | | Water retentivity | | Ink-receptivity | |
|---|---|---|---|---|---|---|
| | Just after preparation | After stored | Just after preparation | After stored | Just after preparation | After stored |
| Comparative A | ○ | ○ | △ | x | 10 | 8 |
| Comparative B | △ | △ | △ | x | 20 | 10 |
| The present C | ○ | ○ | ⊚ | ⊚ | 10 | 8 |
| The present D | ○ | ○ | ⊚ | ⊚ | 10 | 8 |
| The present E | ○ | ○ | ⊚ | ⊚ | 20 | 10 |
| The present F | ○ | ○ | ⊚ | ⊚ | 20 | 10 |
| The present G | ○ | ○ | ⊚ | ⊚ | 30 | 10 |
| Comparative H | ○ | ○ | ⊚ | ⊚ | 10 | 8 |
| Comparative I | ○ | ○ | ⊚ | ⊚ | 20 | 10 |

EXAMPLES 13–21

Lithographic printing plates of Examples 13–21 were produced in the same manner as in Example 12 except that polymers (I-2)-(I-10) used Examples 2–10 were used in place of the polymer (I-1) and Trigluco A was used as the polysaccharide.

As in the Example 12, it was confirmed that the lithographic printing plates made using the water-soluble synthetic polymers of the formula (I) and the water-soluble polysaccharides in combination were excellent in various printing characteristics, especially in water retentivity and besides excellent in stability with time.

What is claimed is:

1. A lithographic printing plate material comprising a support and, provided thereon, at least a silver halide emulsion layer and a physical development nuclei layer wherein the physical development nuclei layer and/or a layer contiguous thereto contains at least one of water-soluble polymers represented by the following formula (I) or at least one of water-soluble polymers represented by the following formula (II):

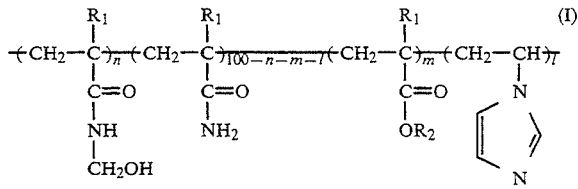

wherein $R_1$ represents H or an alkyl group, $R_2$ represents H or an alkali metal atom, n represents 1–100 mol %, m represents 0–50 mol % and l represents 0–5 mol %,

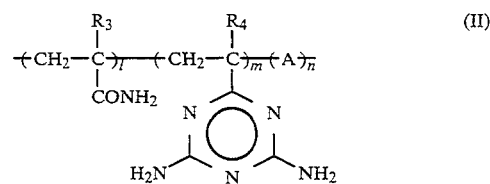

wherein $R_3$ and $R_4$ each represent a hydrogen atom or a lower alkyl group, A represents a residue of an ethylenically unsaturated monomer, l represents 40–99.9 mol %, m represents 0.1–10 mol % and n represents 0–50 mol %.

2. A lithographic printing plate material comprising a support and, provided thereon, at least a silver halide emulsion layer and a physical development nuclei layer wherein the physical development nuclei layer and/or a layer contiguous thereto contains at least one of water-soluble polymers represented by the following formula (I) and a water-soluble polysaccharide in combination:

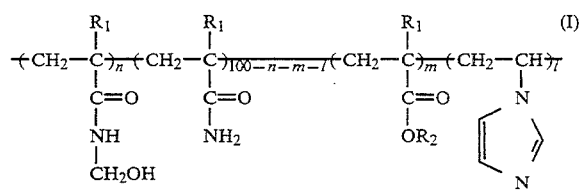

wherein $R_1$ represents H or an alkyl group, $R_2$ represents H or an alkali metal atom, n represents 1–100 mol %, m represents 0–50 mol % and l represents 0–5 mol %.

3. A lithographic printing plate material according to claim 1 or 2 wherein the polymer represented by the formula (I) or (II) has an average molecular weight of 2000–300,000.

4. A lithographic printing plate material according to claim 1 wherein the polymer represented by the formula (II) has an average polymerization degree of 50–3000.

5. A lithographic printing plate material according to claim 1 wherein content of the polymer represented by the formula (I) or (II) is 0.5 g/m² or less.

6. A lithographic printing plate material according to claim 2 wherein the total content of the polymer represented by the formula (I) and the polysaccharide is 0.5 mg/m² or less.

7. A lithographic printing plate material according to claim 2 wherein the ratio of the polymer represented by the formula (I) and the polysaccharide is 1:2–1:8.

8. A method of printing with use of a printing plate made from the lithographic printing plate of claim 1 or 2.

* * * * *